United States Patent [19]

Cesaroni

[11] Patent Number: 5,316,078

[45] Date of Patent: May 31, 1994

[54] PANEL HEAT EXCHANGER WITH INTEGRAL THERMOELECTRIC DEVICE

[76] Inventor: Anthony J. Cesaroni, 9 Heathmore Court, Unionville, Ontario, Canada, L3R 8J1

[21] Appl. No.: 70,722

[22] Filed: May 19, 1993

[30] Foreign Application Priority Data

May 21, 1992 [GB] United Kingdom ............... 9210812
Jun. 23, 1992 [GB] United Kingdom ............... 9213246

[51] Int. Cl.$^5$ ............................................. F25B 21/02
[52] U.S. Cl. ............................ 165/104.33; 165/104.19; 62/3.6; 62/3.7
[58] Field of Search ............ 165/104.33, 104.19; 62/3.6, 3.7

[56] References Cited

U.S. PATENT DOCUMENTS

| | | | |
|---|---|---|---|
| 3,100,969 | 8/1963 | Elfving | 165/104.33 |
| 3,463,904 | 8/1969 | Pauls | 165/104.19 |
| 4,524,757 | 6/1985 | Buckley | 126/426 |
| 4,582,130 | 4/1986 | Modschiedler | 165/104.33 |
| 4,941,530 | 7/1990 | Crowe | 165/104.33 |
| 4,955,435 | 9/1990 | Shuster et al. | 165/170 |

FOREIGN PATENT DOCUMENTS

| | | |
|---|---|---|
| 0286399 | 10/1988 | European Pat. Off. . |
| 0286400 | 10/1988 | European Pat. Off. . |
| 0304261 | 2/1989 | European Pat. Off. . |
| 0337802 | 10/1989 | European Pat. Off. . |
| 13997 | 1/1987 | Japan . |
| 911619 | 11/1962 | United Kingdom ............. 62/3.6 |

*Primary Examiner*—Albert W. Davis, Jr.

[57] ABSTRACT

A substantially planar panel heat exchanger having an elongated liquid storage vessel in the form of a closed loop that is adapted for circulation of liquid. The loop is substantially planar and adapted to be disposed substantially vertically. The elongated storage vessel has a Peltier thermoelectric device located such that one end of the Peltier device is in contact with liquid in the liquid storage vessel and disposed to heat or cool the liquid. The closed loop for the circulation of liquid is comprised of a plurality of vertical tubes formed from a thermoplastic polymer having a diameter in the range of 1.3–6.4 mm and a wall thickness of 0.13–0.76 mm. A first set of tubes is for upward movement of liquid from the Peltier device and a second set of tubes is for downward movement of liquid to the Peltier device. The first and second set of tubes are interconnected to form a closed planar loop and are in fluid flow communication with the end of the Peltier device in contact with liquid in the closed loop. The first and second set of tubes are aligned, linear in cross-section and conform to a planar surface. The circulation loop may contain a pump. The heat exchanger is particularly useful in a portable beverage cooler.

10 Claims, 4 Drawing Sheets

PANEL HEAT EXCHANGER WITH INTEGRAL THERMOELECTRIC DEVICE

The present invention relates to apparatus, especially portable apparatus, in the form of a closed-loop, substantially planar, panel heat exchanger having a thermoelectric device as an integral part of the panel heat exchanger.

Apparatus having a heat exchanger that utilizes a thermoelectric device is known. For instance, French patent No. 2 537 712 of Philippe Droit, published Jun. 15, 1984 discloses a portable apparatus that includes a heat exchanger with a thermoelectric device, part of the heat exchanger being adapted for exchange of heat by convection. The heat exchanger is formed from an impermeable material e.g. aluminum or plastic material.

A panel heat exchanger of improved efficiency and light in weight, especially for use in portable cooling apparatus, would be beneficial. Such a heat exchanger has now been found.

Accordingly, the present invention provides a substantially planar panel heat exchanger, consisting essentially of an elongated liquid storage vessel in the form of a closed loop that is adapted for circulation of said liquid, said loop being substantially planar and being adapted to be disposed substantially vertically; the elongated storage vessel having a Peltier thermoelectric device located such that one end of the thermoelectric device is in contact with liquid in the liquid storage vessel and being disposed to heat or cool the liquid; the closed loop for the circulation of liquid being comprised of a plurality of vertical tubes formed from a thermoplastic polymer having a diameter in the range of 1.3–6.4 mm and a wall thickness of 0.13–0.76 mm, a first set of tubes being adapted for upward movement of liquid from the Peltier device and a second set of tubes being disposed for downward movement of liquid to the Peltier thermoelectric device, said first set of tubes and said second set of tubes being interconnected to form a closed planar loop and being in fluid flow communication with the said one end of the Peltier thermoelectric device in contact with liquid in the closed loop, said first set of tubes and said second set of tubes being aligned, linear in cross-section and conforming to a planar surface; and an electrical connection for the Peltier thermoelectric device.

In a preferred embodiment of the present invention, the panel heat exchanger is disposed in a vertical orientation in a housing, said housing having vents in upper and lower sections thereof in fluid flow communication with the exterior of said tubes for the removal of heat therefrom by convection.

In another embodiment, the closed loop for the circulation of liquid has a pump to circulate said liquid.

In yet another embodiment, the panel heat exchanger is adapted for the heating of liquid in the closed loop, and especially has the thermoelectric device in a lower section thereof.

In a further embodiment, the closed loop is in the form of a double loop with a common central section, with the thermoelectric device being located in the common section.

The present invention also relates to a panel heat exchanger consisting essentially of an elongated liquid storage vessel in the form of a closed loop that is adapted for circulation of said liquid, said loop conforming to the shape of a planar or non-planar surface and being adapted to be disposed substantially vertically; the elongated storage vessel having a Peltier thermoelectric device located such that one end of the thermoelectric device is in contact with liquid in the liquid storage vessel and being disposed to heat or cool the liquid; the closed loop for the circulation of liquid being comprised of a plurality of vertical tubes formed from a thermoplastic polymer having a diameter in the range of 1.3–6.4 mm and a wall thickness of 0.13–0.76 mm, a first set of tubes being adapted for upward movement of liquid from the Peltier device and a second set of tubes being disposed for downward movement of liquid to the Peltier thermoelectric device, said first set of tubes and said second set of tubes being interconnected to form a closed loop conforming to said planar or non-planar surface and being in fluid flow communication with the said one end of the Peltier thermoelectric device in contact with liquid in the closed loop, said first set of tubes and said second set of tubes being aligned and conforming to the planar or non-planar surface and additionally being linear or curved in cross-section; and an electrical connection for the Peltier thermoelectric device.

The present invention relates to a closed loop panel heat exchanger having a thermoelectric device integral with the closed loop. In embodiments, the panel heat exchanger is substantially planar i.e. the closed loop conforms to a plane, with the sections of the loop being in a side-by side relationship and a cross-sectional view being linear in nature. In other embodiments, the panel heat exchanger conforms to the shape of a non-planar surface. The sections of the loop are still in a side-by-side relationship, except that the loop is no longer planar; in cross-section the loop is linear or curved. In such embodiments, the panel heat exchanger, including the loop, may conform to a curved surface e.g. part of a cylinder, sphere, cone or other curved surface, or even part of a cube i.e. have right-angled sections. However, in cross-section the loop is not circular, ovate or looped in any other manner.

The heat exchanger will be described with particular reference to the drawings in which.

Figure 1:
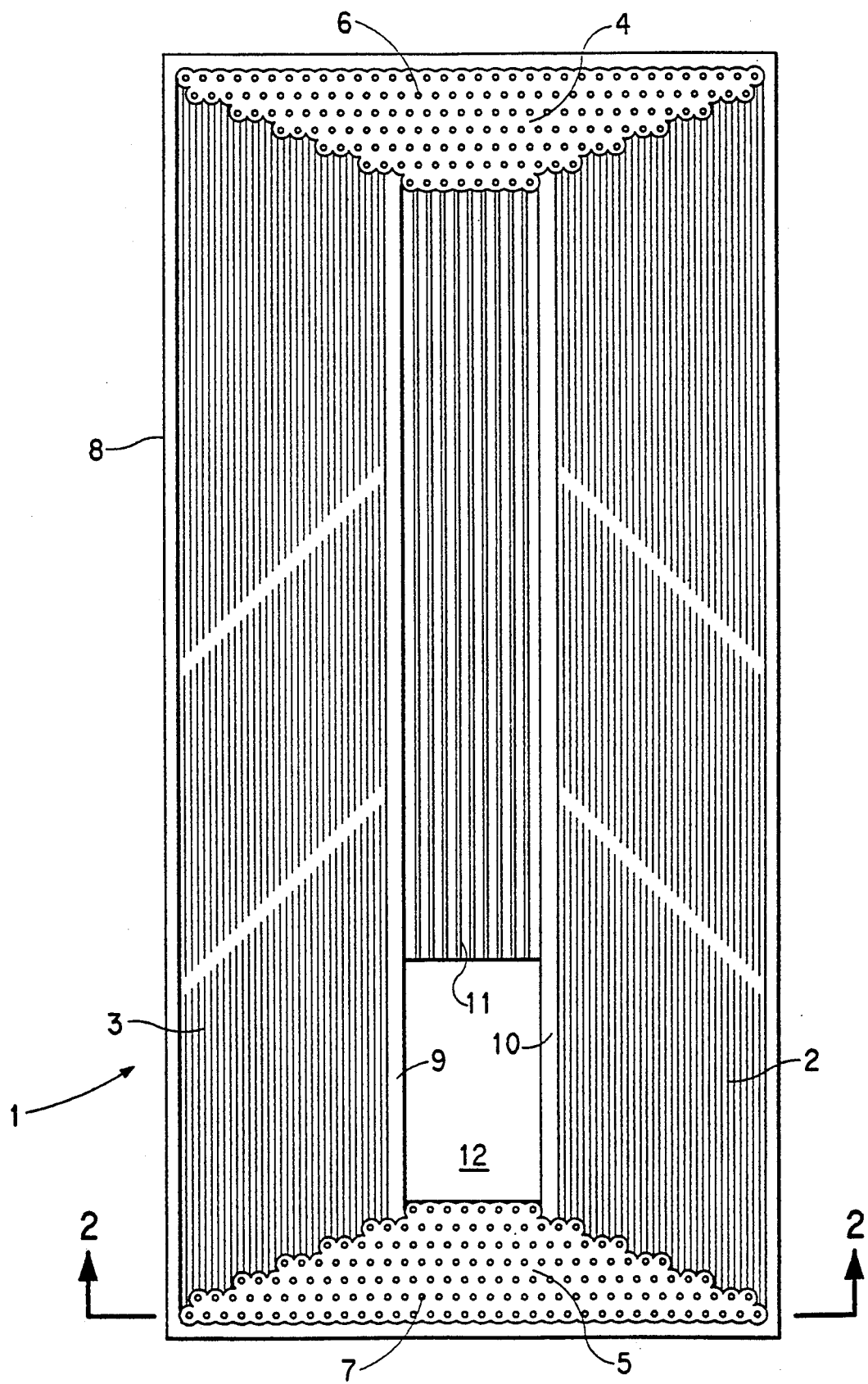
FIG. 1 is a schematic representation of a perspective of a panel heat exchanger having a thermoelectric device.

Referring to FIG. 1, the panel heat exchanger, generally indicated by 1, has a first set of parallel tubes 2 and a second set of parallel tubes 3. Each set of parallel tubes 2 and 3 is in the form of a plurality of parallel tubes, with in addition the set of parallel tubes 2 being shown as disposed parallel to the set of parallel tubes 3 i.e. in a planar heat exchanger the sets of parallel tubes 2 and 3 are in the same plane, and thus in a side-by-side, albeit spaced apart, relationship. At each end, the first set of parallel tubes 2 is interconnected with the second set of parallel tubes 3, through upper manifold 4 and lower manifold 5, respectively. Each of upper manifold 4 and lower manifold 5 has a plurality of islands 6 and 7, respectively, that maintain the panels forming the manifolds in a spaced apart relationship, to permit flow of fluid therebetween. Parallel tubes 2 and 3 together with manifolds 4 and 5 form a closed loop, all in fluid flow communication.

Parallel tubes 2, 3 and manifolds 4, 5 are enclosed by edge 8 that forms a fluid tight seal around the entire periphery of the closed loop. In addition, the first set of parallel tubes 2 is spaced apart from the second set of parallel tubes 3 by first wall 9 and second wall 10. First wall 9 and second wall 10 are spaced apart, with the intervening space containing central tubes 11 and module space 12. Central tubes 11 extend for the major portion of the length of parallel tubes 2 and 3, extending between upper manifold 4 on the upper end of the heat exchanger to the module space 12, which is located towards the lower end of the heat exchanger; this is the orientation that would normally be used when the apparatus is used for cooling i.e. the thermoelectric device is dissipating heat into the fluid in the closed loop. Module space 12 extends from the lower end of central tubes 11 to lower manifold 5. Central tubes 11 and module space 12 are in fluid flow communication, such that fluid may flow from lower manifold 5, through module space 12 and central tubes 11 and into upper manifold 4. The combination of central tubes 11 and module space 12, together with parallel tubes 2 and 3 and manifolds 4 and 5 provides a double, butterfly shaped, loop in the embodiment shown; it is to be understood that one of the sets of parallel tubes may be omitted. The thermoelectric device, which occupies module space 12, is not shown in FIG. 1.

Figure 2:
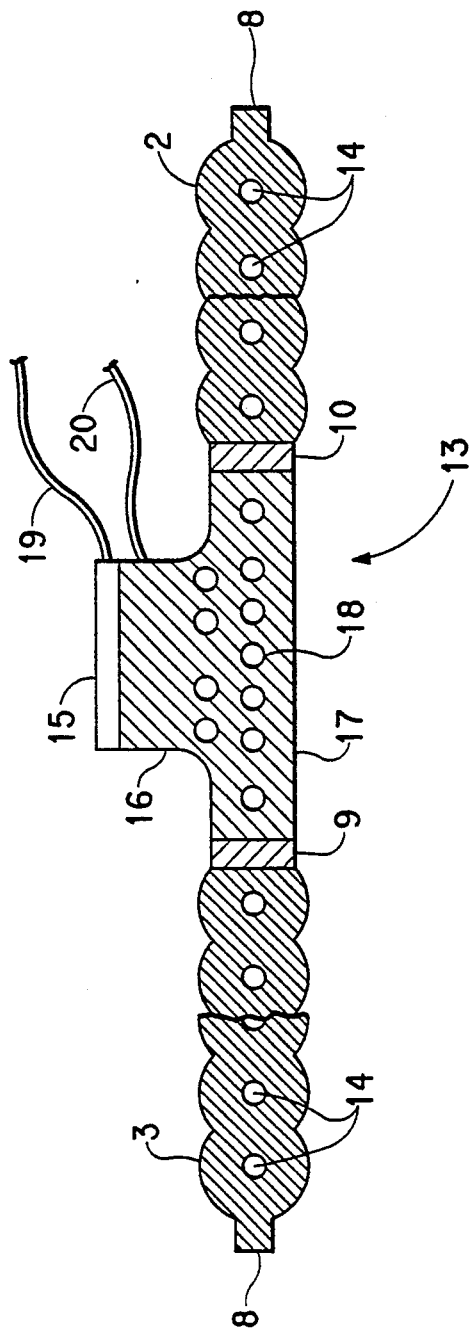
FIG. 2 is a schematic representation of a cross-section of the panel heat exchanger through 2—2 of FIG. 1.

FIG. 2 shows a module, generally indicated by 13, which occupies module space 12 shown in FIG. 1. Module 13 is connected on one side to first wall 9 and on the other side to second wall 10. In turn, first wall 9 is shown as connected to the set of parallel tubes 3, which end at outer wall 8. Similarly, second wall 10 is shown as connected to the set of parallel tubes 2, which end at outer wall 8. Parallel tubes 2 and 3 are shown as having fluid passages 14.

Module 13 is formed from a heat conductive material, usually a metal, that is capable of conducting heat from the thermoelectric device 15, and is the means of conducting heat from the thermoelectric device to the liquid in the loop. Module 13 has a block 16 having thermoelectric device 15 on one side thereof and with block face 17 on the opposing side. Thermoelectric device 15 would normally be connected to a metal plate, likely a metal plate that forms part of the wall of a chamber or other location within the housing in which objects or articles to be cooled are located. Block face 17 forms part of the surface of the panel heat exchanger that is subject to convection for removal of heat. Block 16 has a plurality of fluid flow passages 18 therein, which are shown as being located juxtaposed to block face 17, but which could be located elsewhere in block 16; a series of fins could be used to form the fluid flow passages. Fluid flow passages 18 are connected at opposite ends thereof with lower manifold 5 and with central tubes 11, respectively, for the flow of fluid from lower manifold 5 to central tubes 11.

Electrical wires 19 and 20 are shown as being connected to the thermoelectric device 15. Electrical wires 19 and 20 are connected to, or adapted to be connected to, a DC source of electricity.

Figure 3:
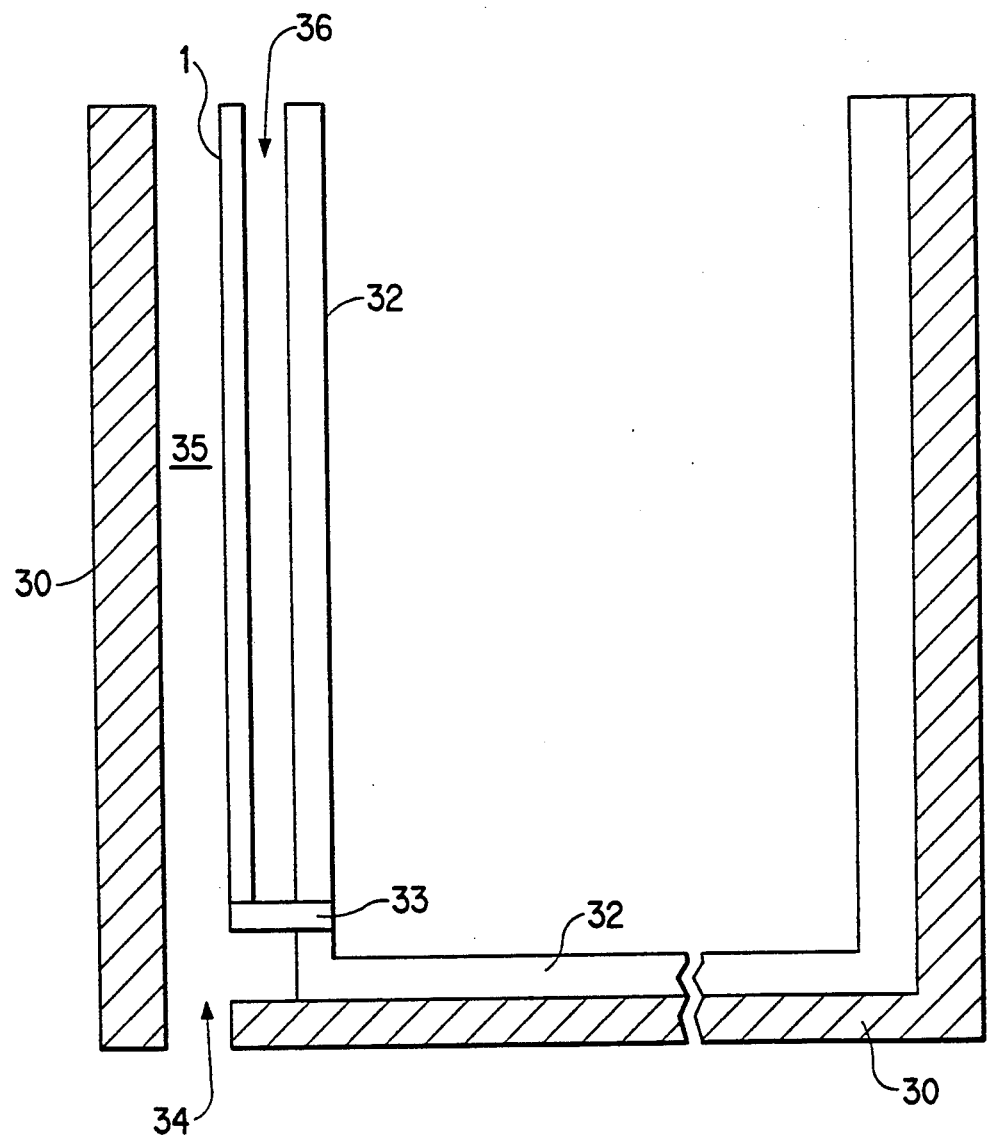
FIG. 3 is a schematic representation of a cross-section of a panel heat exchanger in a housing.

FIG. 3 shows a cross-section of a panel heat exchanger in a housing. Housing 30 contains a panel heat exchanger 1 and interior surface 32. Interior surface 32 and panel heat exchanger 1 are interconnected through thermoelectric device 33, one end of which forms part of panel heat exchanger 1 and the other end of which is integral with interior surface 32. Interior surface 32 needs to be heat conductive, and may be in the form of, for example, a metal sheet or a metal sheet embedded in another material i.e. in the form of a sheet or a laminate or other composite structure. Opening 34 in housing 30 connects to air passage 35; opening 34 may also be connected to interior air passage 36.

Figure 4A:
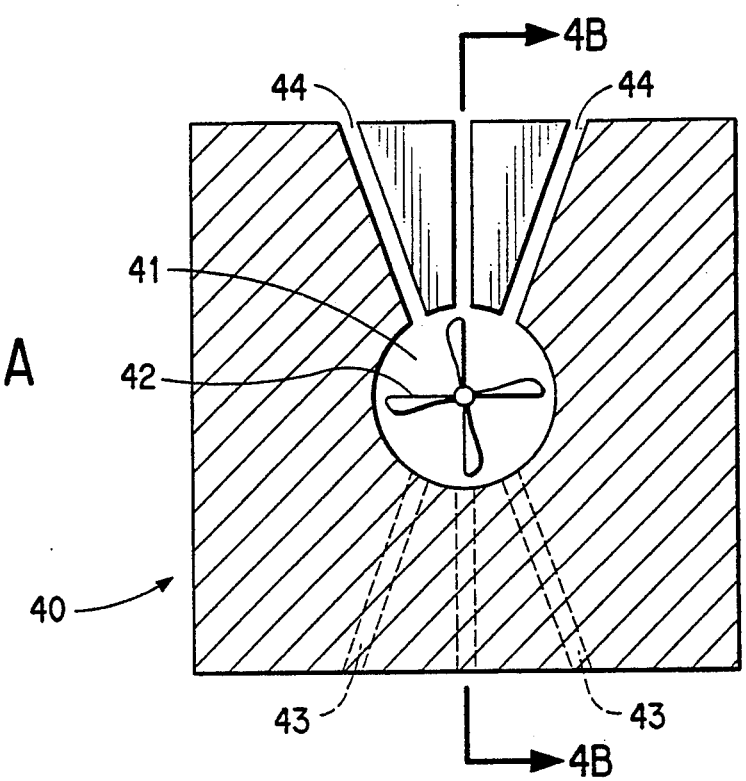
FIG. 4A is a front sectional view taken through line 4A—4A of FIG. 4B.
Figure 4B:
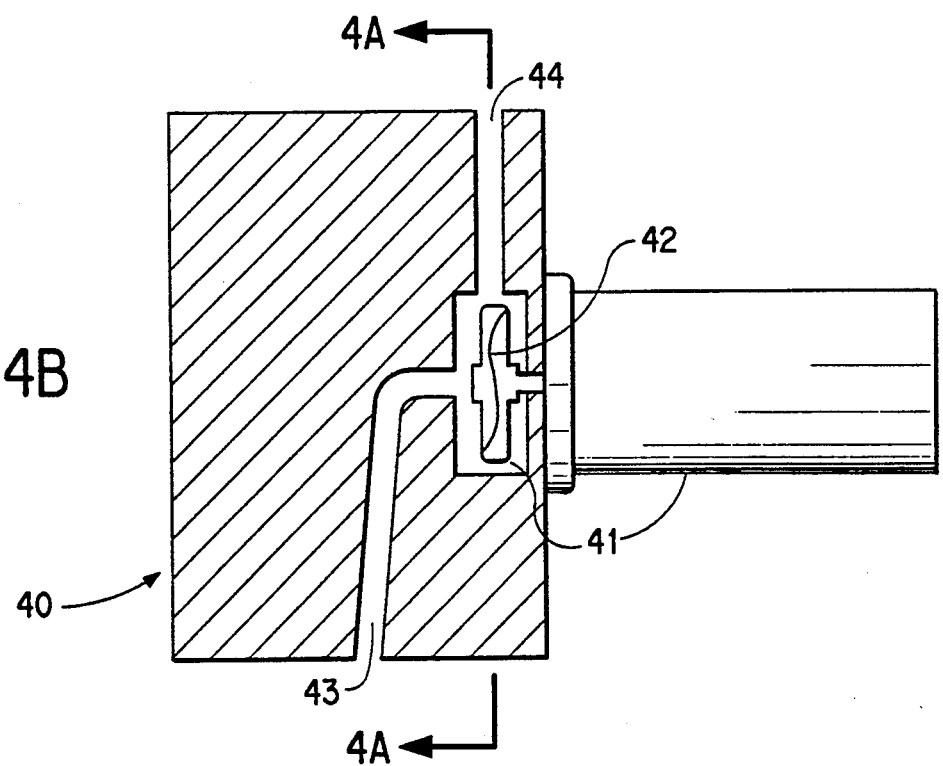
FIG. 4B is a part sectional view taken through line 4B—4B of FIG. 4A.

FIGS. 4A and 4B illustrate the embodiment in which a pump is incorporated into the circulation loop. In FIG. 4A, module 40 has internal chamber 41 in which is located pump impeller 42. Inlet channels 43 connect the circulation loop, especially lower manifold 5 of FIG. 1 (not shown in FIG. 4A), to internal chamber 41. Similarly, outlet channels 44 connect internal chamber 41 to the circulation loop, especially central tubes 11 of FIG. 1 (not shown in FIG. 4A).

FIG. 4B shows the section of FIG. 4A taken through line 4B—4B of FIG. 4A. The module is generally indicated by 40. Module 40 has pump housing 51 attached to the side thereof. Pump housing 51 is connected to impeller 42, which is located in internal chamber 41 in module 40. Inlet channel 43 passes through module 40 and connects with internal chamber 41 at the axial location of impeller 42. Outlet channel 44 passes from internal chamber 41 through module 40. As indicated above, the inlet and outlet channels provide fluid flow communication through module 50 e.g. between lower manifold 5 of FIG. 1, through the pump and to central tubes 11 of FIG. 1. An example of a pump that may be used is a Xolox Picopump ™ plastic pump available from Xolox Corporation of Fort Wayne, Ind., U.S.A.

The invention has been described herein with particular reference to the use of an impeller pump but it is to be understood that other types of pumps may be used, including vibrating coil pumps and diaphragm pumps. In some circumstances, the latter pumps may be preferred.

Although the invention has been described herein with respect to the use of a single panel heat exchanger, it is to be understood that a stack of panel heat exchangers could be used, each with its own loop but using a common thermoelectric device. It is also apparent that a housing could contain more than one panel heat exchanger.

In operation, electricity is caused to flow through the electrical wires 19 and 20, by turning on a switch (not shown) or suitably plugging the wires into a source of DC electricity e.g. to a battery. The thermoelectric device is oriented (or the electrical connections are connected) such that the surface of the thermoelectric device 15 in contact with block 16 is heated; the opposing surface of the thermoelectric device is thus cooled. Heat is conducted through block 16 to fluid located in fluid passages 18. This fluid is heated and rises, thereby resulting in flow of fluid up central tubes 11 and into upper manifold 4. The fluid then returns down first set of parallel tubes 2 and second set of parallel tubes 3 to lower manifold 5. Fluid thus circulates in a continuous manner. Heat is dissipated through the walls of the panel heat exchanger and removed by convection of air passed the surface of the panel heat exchanger.

With reference to FIG. 3, the heat from thermoelectric device 33 is dissipated into panel heat exchanger 31. Air flows through opening 34 and up passage 35, and internal passage 36 if this is connected to opening 34, thereby removing heat from the panel heat exchanger.

In the embodiments shown in FIG. 4A and 4B, a pump is used to promote circulation of liquid in the circulation loop. A suitable electrical connection e.g. to a battery, would be required. The pump receives liquid e.g. from lower manifold 5 of FIG. 1, through inlet channels 54 and passes the liquid out through outlet channels 55 e.g. to central tubes 11 of FIG. 1. A more efficient removal of heat from the module, and hence from the thermoelectric device, is achieved.

The tubes may have a diameter in the range of 1.3–6.4 mm, especially in the range of 2.0–5.0 mm. The wall thickness may be in the range of 0.13–0.76 mm, especially in the range of 0.2–0.5 mm.

The panel heat exchanger may be made using techniques known in the art, for example using the techniques described in published European patent application No. 0 304 361 of A.J. Cesaroni. The thermoelectric module may be bonded to the panels of the panel heat exchanger using an adhesive that is suitable for the polymer of the panels and which will withstand the conditions of use. A variety of polymers may be used, as the demands on the polymer, especially temperature of operation, are not high. Examples of polymers include polyamides, as described in the above European patent application, but other polymers e.g. polyolefins, polyesters and polyvinyl chloride, or the like may be used. Conditions of use and selection of the liquid to be used in the closed loop will be important considerations in the selection of the polymer. The panel heat exchanger may be used in portable apparatus or in stationary apparatus where cooling is required and the demands on such cooling are not high. Moreover, the apparatus is slim and can fit into thin spaces as the heat exchanger is generally planar. For example, the heat exchanger could have a thickness, including the space for convection of air of less than 2.5 cm and especially less than 1.5 cm. The shape of the panel heat exchanger may be adapted to the shape of the housing and/or to the shape of the space that is to be cooled. Thus, the design is very flexible. The panel heat exchanger does not impose high demands on space in order to operate. For instance, use of tubes of a thickness of 6.4 mm and wall thicknesses of 0.76 mm results in a thickness of the panel heat exchanger of less than 8 mm; use of thinner tubes and thinner walls results in lower thickness for the panel heat exchanger. In addition,, the panel heat exchangers may readily be fabricated.

I claim:

1. A substantially planar panel heat exchanger, consisting essentially of an elongated liquid storage vessel in the form of a closed loop that is adapted for circulation of said liquid, said loop being substantially planar and being adapted to be disposed substantially vertically; the elongated storage vessel having a Peltier thermoelectric device located such that one end of the thermoelectric device is in contact with liquid in the liquid storage vessel and being disposed to heat or cool the liquid; the closed loop for the circulation of liquid being comprised of a plurality of vertical tubes formed from a thermoplastic polymer having a diameter in the range of 1.3–6.4 mm and a wall thickness of 0.13–0.76 mm, a first set of tubes being adapted for upward movement of liquid from the Peltier device and a second set of tubes being disposed for downward movement of liquid to the Peltier thermoelectric device, said first set of tubes and said second set of tubes being interconnected to form a closed planar loop and being in fluid flow communication with the said one end of the Peltier thermoelectric device in contact with liquid in the closed loop, said first set of tubes and said second set of tubes being aligned, linear in cross-section and conforming to a planar surface; and an electrical connection for the Peltier thermoelectric device.

2. The panel heat exchanger of claim 1 in which the panel heat exchanger is disposed in a vertical orientation in a housing, said housing having vents in upper and lower sections thereof in fluid flow communication with the exterior of said tubes for the removal of heat therefrom by convection.

3. The panel heat exchanger of claim 1 in which the apparatus is adapted for the heating of liquid in the closed loop.

4. The panel heat exchanger of claim 3 in which the thermoelectric device is in a lower section thereof.

5. The panel heat exchanger of claim 1 in which the closed loop is in the form of a double loop with a common central section, with the thermoelectric device being located in the common section.

6. The panel heat exchanger of claim 1 in which a heat conductive material is adapted to conduct heat between the Peltier thermoelectric device and the liquid.

7. The panel heat exchanger of claim 1 in which the closed loop for the circulation of liquid has a pump to circulate said liquid.

8. A panel heat exchanger consisting essentially of an elongated liquid storage vessel in the form of a closed loop that is adapted for circulation of said liquid, said loop conforming to the shape of a planar or non-planar surface and being adapted to be disposed substantially vertically; the elongated storage vessel having a Peltier thermoelectric device located such that one end of the thermoelectric device is in contact with liquid in the liquid storage vessel and being disposed to heat or cool the liquid; the closed loop for the circulation of liquid being comprised of a plurality of vertical tubes formed from a thermoplastic polymer having a diameter in the range of 1.3–6.4 mm and a wall thickness of 0.13–0.76 mm, a first set of tubes being adapted for upward movement of liquid from the Peltier device and a second set of tubes being disposed for downward movement of liquid to the Peltier thermoelectric device, said first set of tubes and said second set of tubes being interconnected to form a closed loop conforming to said planar or non-planar surface and being in fluid flow communication with the said one end of the Peltier thermoelectric device in contact with liquid in the closed loop, said first set of tubes and said second set of tubes being aligned and conforming to the planar or non-planar surface and additionally being linear or curved in cross-section; and an electrical connection for the Peltier thermoelectric device.

9. The panel heat exchanger of claim 7 which a heat conductive material is adapted to conduct heat between the Peltier thermoelectric device and the liquid.

10. The panel heat exchanger of claim 8 in which the closed loop for the circulation of liquid has a pump to circulate said liquid.

* * * * *